United States Patent
Le Vaillant

(10) Patent No.: US 7,981,768 B2
(45) Date of Patent: Jul. 19, 2011

(54) METHOD FOR TRANSFERRING AN EPITAXIAL LAYER

(75) Inventor: Yves-Matthieu Le Vaillant, Crolles (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 32 days.

(21) Appl. No.: 12/528,573

(22) PCT Filed: Apr. 15, 2008

(86) PCT No.: PCT/IB2008/000967
§ 371 (c)(1),
(2), (4) Date: Aug. 25, 2009

(87) PCT Pub. No.: WO2008/132569
PCT Pub. Date: Nov. 6, 2008

(65) Prior Publication Data
US 2011/0008948 A1    Jan. 13, 2011

(30) Foreign Application Priority Data
Apr. 27, 2007 (FR) .................................. 07 54777

(51) Int. Cl.
*H01L 21/30* (2006.01)
(52) U.S. Cl. .................... 438/459; 257/E21.567
(58) Field of Classification Search ............ 438/459, 438/455, 458
See application file for complete search history.

(56) References Cited

U.S. PATENT DOCUMENTS

| | | | | |
|---|---|---|---|---|
| 5,250,460 A * | 10/1993 | Yamagata et al. | ............ | 438/458 |
| 5,374,564 A | 12/1994 | Bruel | ................ | 437/24 |
| 6,210,479 B1 | 4/2001 | Bojarczuk et al. | ............ | 117/84 |
| 6,372,608 B1 * | 4/2002 | Shimoda et al. | ............ | 438/455 |
| 6,559,075 B1 | 5/2003 | Kelly et al. | ............ | 438/795 |
| 6,566,255 B2 * | 5/2003 | Ito | ................ | 438/660 |
| 7,217,639 B2 * | 5/2007 | Maurice et al. | ............ | 438/458 |
| 2002/0168864 A1 | 11/2002 | Cheng et al. | ............ | 438/725 |
| 2002/0182839 A1 | 12/2002 | Ogawa et al. | ............ | 438/604 |
| 2005/0136624 A1 * | 6/2005 | Cheng et al. | ............ | 438/478 |
| 2007/0037362 A1 * | 2/2007 | Bahl | ............ | 438/455 |

FOREIGN PATENT DOCUMENTS

| | | |
|---|---|---|
| EP | 0 858 110 | 8/1998 |
| JP | 2006 287166 | 10/2006 |

OTHER PUBLICATIONS

International Search Report, PCT/IB2008/000967, dated Jul. 7, 2008.
E.P. Donovan, et al., "Heat of Crystallization and Melting Point of Amorphous Silicon", Applied Physics Letters, vol. 42, No. 8, pp. 698-700, (1983).
A.J. Aubreton-Hervé et al., "Why can Smart-Cut change the future of microelectronics?", Int. Journal of High Speed Electronics and Systems, vol. 10, No. 1, pp. 131-146, (2000).

* cited by examiner

*Primary Examiner* — Charles D Garber
*Assistant Examiner* — Reema Patel
(74) *Attorney, Agent, or Firm* — Winston & Strawn LLP

(57) ABSTRACT

A method for producing an epitaxial layer. First, a structure is fabricated by: formation of an intermediate layer on a donor substrate; and formation of the epitaxial layer on the intermediate layer by epitaxy; with the melting temperature of the intermediate layer being lower than the melting temperature of the epitaxial layer; and then a detachment step for transferring the epitaxial layer from the donor substrate. The detachment step includes applying at least one thermal treatment performed at a temperature of between the melting temperature of the intermediate layer and the melting temperature of the epitaxial layer.

14 Claims, 4 Drawing Sheets

US 7,981,768 B2

METHOD FOR TRANSFERRING AN EPITAXIAL LAYER

This application is a 371 filing of International Patent Application PCT/IB2008/000967 filed Apr. 15, 2008.

BACKGROUND OF THE INVENTION

The present invention relates to a method for producing an epitaxial layer able to be implemented in fabrication of semiconductor structures and in particular in fabrication of SOI (Silicon On Insulator) or more generally SeOI (Semiconductor On Insulator) structures for electronics, microelectronics or optoelectronics applications.

In well-known manner, during fabrication of SeOI structures, the epitaxial layer can first of all be formed on a donor substrate and then be transferred onto a receiver substrate or support substrate. This method of fabrication can in particular be implemented using the SmartCut™ technology. An example of implementation of the SmartCut™ technology is described in the document U.S. Pat. No. 5,374,564 or in the article by A. J. Aubreton-Hervé et al. entitled "Why can Smart-Cut change the future of microelectronics?", Int. Journal of High Speed Electronics and Systems, Vol. 10, No 1, 2000, p. 131-146.

The SmartCut™ technology is a technology widely used in numerous applications. However, in certain particular cases, it may be interesting to be able to use another transfer technology, in particular to limit the risks of damaging certain circuits when transfer is performed by implantation.

SUMMARY OF THE INVENTION

The object of the invention is to propose a method for producing an epitaxial layer whereby the epitaxial layer can be detached from the donor substrate after formation thereof.

For this purpose, the invention relates to a method for producing an epitaxial layer comprising:
  a fabrication step of a structure comprising:
    formation of an intermediate layer on a donor substrate; and
    formation of the epitaxial layer on the intermediate layer by epitaxy; the melting temperature of the intermediate layer being lower than the melting temperature of the epitaxial layer; and
  a detachment step of the epitaxial layer from the donor substrate by applying at least one thermal treatment, this thermal treatment being performed at a temperature comprised between the melting temperature of the intermediate layer and the melting temperature of the epitaxial layer.

Formation between the donor substrate and the epitaxial layer of an intermediate layer having a lower melting temperature than the melting temperature of the epitaxial layer thus enables the epitaxial layer to be detached from the substrate by melting of the intermediate layer. For this purpose, thermal treatment is applied at a temperature comprised between the melting temperature of the intermediate layer and the melting temperature of the epitaxial layer. This thermal treatment leads to the intermediate layer melting without damaging the epitaxial layer.

Furthermore, following the detachment step, after the remainder of the intermediate layer located at its surface has been removed, the donor substrate can advantageously be reused for producing a new epitaxial layer, for example according to the production method according to the invention.

In a particular embodiment, after the fabrication step and before the detachment step, the method according to the invention further comprises a bonding step of the epitaxial layer to a support substrate.

The method according to the invention thus enables a structure to be produced by transfer of an epitaxial layer from a donor substrate onto a receiver substrate or support substrate. Such a method can advantageously be used for producing heterostructures (for example of SeOI type) for electronics, microelectronics or optoelectronics applications.

In a particular embodiment, the method according to the invention is characterized in that the support substrate to which the epitaxial layer is bonded comprises an oxide layer at its surface.

The method according to the invention thereby advantageously enables SeOI structures to be fabricated.

In a particular embodiment, the bonding step of the method according to the invention is performed by molecular bonding. As an alternative, other types of bonding can be implemented during the bonding step of the method according to the invention, such as for example anodic or eutectic bonding, or adhesive bonding.

During the detachment step of the method according to the invention, mechanical separating forces can further be applied at the same time as the thermal treatment.

Such separating forces enable the epitaxial layer to be detached more easily and more quickly from the donor substrate.

The bonding step according to the invention can be followed by a thermal treatment step of strengthening the bonding interface.

In a particular embodiment, the method according to the invention further comprises a removal step of the remainder of intermediate layer remaining on the detached epitaxial layer.

In another particular embodiment, during the fabrication step of the method according to the invention, the intermediate layer is formed by epitaxy on the donor substrate.

According to one feature of the invention, during the fabrication step of the method according to the invention, the intermediate layer and the donor substrate are formed from a SeOI structure.

According to another feature of the invention, during the fabrication step of the method according to the invention, the intermediate layer and the epitaxial layer are formed from silicon-germanium, the intermediate layer being formed with a higher germanium concentration than that of the epitaxial layer so that the melting temperature of the intermediate layer is lower than the melting temperature of the epitaxial layer.

Thus, in simple manner, the epitaxial layer and intermediate layer can advantageously be formed by alloys of the same elements (for example in this embodiment from silicon-germanium) taken in different concentrations to enable melting of the intermediate layer. The melting temperature of silicon-germanium being a decreasing function of the germanium concentration according to Stohr and Klemm's calculations, the germanium concentration in the intermediate layer must be greater than the germanium concentration in the epitaxial layer.

In a particular embodiment, during the fabrication step of the production method according to the invention:
  the donor substrate and intermediate layer are formed from silicon-germanium, the germanium concentration in the intermediate layer being greater than the germanium concentration in the donor substrate; and
  the epitaxial layer is formed by growth of a strained silicon (sSI) layer on said intermediate layer.

According to one feature of the invention, during the fabrication step of the production method according to the invention, at least one spacer layer is formed between the donor substrate and the intermediate layer and/or between the intermediate layer and the epitaxial layer.

In another particular embodiment, during the fabrication step of the production method according to the invention:
the donor substrate is formed from silicon covered with a silicon dioxide layer;
the intermediate layer is formed from germanium; and
the epitaxial layer is formed from gallium arsenide.

In yet another particular embodiment, during the fabrication step of the production method according to the invention:
the donor substrate is formed from sapphire;
the intermediate layer is formed from indium nitride (InN); and
the epitaxial layer is formed from gallium nitride (GaN).

BRIEF DESCRIPTION OF THE FIGURES

The features and advantages of the present invention will become more clearly apparent from the following description, given for non-restrictive example purposes only with regard to the accompanying drawings in which.

DETAILED DESCRIPTION OF EMBODIMENTS OF THE INVENTION

The object of the present invention is to produce an epitaxial layer and applies in this respect to fabrication of numerous semiconducting material structures. The epitaxial layer produced during the production method of the invention can be detached on its own (for example self-supported layer) or after transfer onto a support substrate depending on the applications involved.

Thus, the invention has a privileged but non-exhaustive application in fabrication of heterostructures such as SeOI (Semiconductor On Insulator) structures, such as for example gallium arsenide on insulator (AsGaOI) structures, gallium nitride on insulator (GaNOI) structures, strained silicon on insulator (sSOI) structures, and so on.

The principle of the invention consists in forming an intermediate layer between a donor substrate and an epitaxial layer the melting temperature of which intermediate layer is lower than the melting temperature of the epitaxial layer. Applying a thermal treatment to the structure obtained (structure comprising the substrate, intermediate layer and epitaxial layer) enables the intermediate layer to be made to melt and the epitaxial layer to be detached from the substrate at the level of the melted intermediate layer. To enable the intermediate layer to melt without damaging the epitaxial layer, the thermal treatment is performed at a temperature comprised between the melting temperature of the epitaxial layer and the melting temperature of the intermediate layer.

A method for producing an epitaxial layer according to the invention will now be described in a particular embodiment with reference to FIGS. 1A to 1E and 2.

Figure 1A:
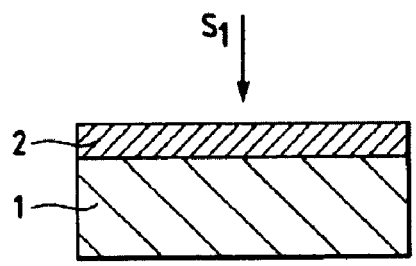
FIGS. 1A to 1E are schematic cross-sectional views showing production of an epitaxial layer according to an embodiment of the invention.
Figure 1B:
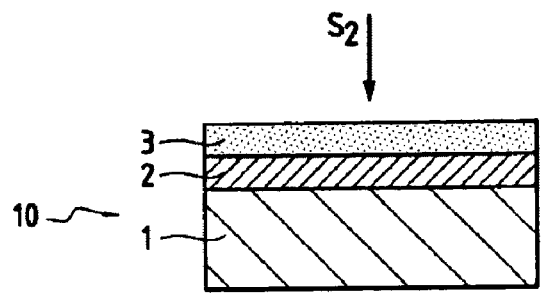
Figure 1C:
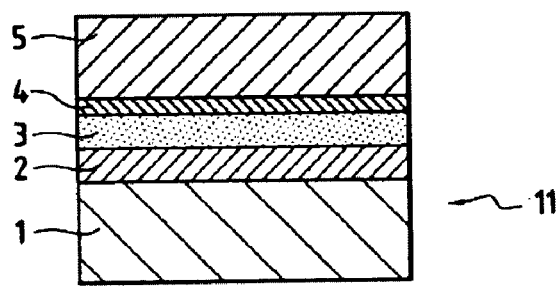

A donor substrate 1 is first of all considered (FIG. 1A). This substrate can be of any type, for example a monocrystalline silicon substrate, a silicon-germanium substrate, etc. In the example described here, it is assumed that donor substrate 1 is a monocrystalline sapphire substrate. Other examples of donor substrate will be described further on with reference to FIGS. 3, 4 and 5.

During a first step S1 (FIG. 1A), an intermediate layer 2 is formed by epitaxial growth on donor substrate 1. The epitaxy technique implemented for epitaxial growth of intermediate layer 2 can be of various kinds. Thus, for example, it may involve epitaxy by Chemical Vapor Deposition (CVD), Metallo-Organic Chemical Vapor Deposition (MOCVD), Hybrid Vapor Phase Epitaxy (HVPE) or Molecular Beam Epitaxy (MBE).

In the example described here, intermediate layer 2 is a layer formed from indium nitride (InN). Its melting temperature $Tf_{(2)}$ is equal to $Tf_{(2)}=1373°$ C.

In a step S2 (FIG. 1B), a gallium nitride (GaN) layer is formed by epitaxial growth on intermediate layer 2 of indium nitride. The GaN layer thus obtained is an epitaxial layer 3 in the sense of the invention. In the same way as for step S1, the epitaxy technique implemented can in particular be of the CVD, MOCVD, HVPE or MBE type.

The melting temperature $Tf_{(3)}$ of epitaxial layer 3 is equal to $Tf_{(3)}=2500°$ C.

Thus, the first two steps S1 and S2 enable a structure 10 to be fabricated (FIG. 1B) comprising a donor substrate 1, an intermediate layer 2 and an epitaxial layer 3. According to the invention, intermediate layer 2 has a lower melting temperature $Tf_{(2)}$ than melting temperature $Tf_{(3)}$ of epitaxial layer 3.

Intermediate layer 2 can be obt
ained by other techniques than epitaxial growth. Thus, in another embodiment of the invention, intermediate layer 2 and donor substrate 1 of structure 10 are formed from a SeOI structure. Intermediate layer 2 is thus formed by the top layer of the SeOI structure, whereas donor substrate 1 is thus formed by the layer of silicon covered with silicon dioxide. This SeOI structure was for example obtained during a previous layer transfer process implementing the SmartCut™ technology. It is chosen such that melting temperature $Tf_{(2)}$ of intermediate layer 2 is lower than melting temperature $Tf_{(3)}$ of epitaxial layer 3.

During a step S3 (FIG. 1C), a support substrate 5 is bonded by molecular bonding to structure 10. In the example described here, support substrate 5 is a silicon substrate covered by an oxide layer 4 (silicon dioxide in this case).

In another embodiment of the invention, an insulator layer is formed on structure 10. This insulator layer in particular ensures that good quality bonding is achieved. As an alternative embodiment, an insulator layer is formed both on support substrate 5 and on structure 10.

The principle of adhesion by molecular bonding is well known as such and will not be described in greater detail here. As a reminder, adhesion by molecular bonding is based on bringing two surfaces into close contact, i.e. without the use of a specific material (adhesive, glue, wax, low melting temperature metal, etc.) the attractive forces between the two surfaces being strong enough to result in molecular bonding (bonding induced by the set of attractive forces (Van der Waals forces) involving electronic interaction between atoms and molecules of the two surfaces to be bonded).

Other types of bonding can be implemented in the bonding step S3. Let us mention for example anodic bonding, eutectic bonding or adhesive bonding, provided that the adhesive or eutectics, and in general manner the bonding used, can withstand a temperature in the region of the melting temperature of intermediate layer 2. The one skilled in the art can refer to the article by S. Farrens et al. entitled "Chip manufacturers look to wafer-bonding technology", Compound Semiconductor Magazine, vol. 8, issue 8, September 2002, for further details on these different bonding techniques.

Following bonding step S3, detachment of epitaxial layer 3 from donor substrate 1 is performed by applying thermal treatment in a step S4. This thermal treatment is performed at a temperature T comprised between melting temperature $Tf_{(2)}$ of intermediate layer 2 and melting temperature $Tf_{(3)}$ of epitaxial layer 3. In the example described here, temperature T is taken around or slightly above melting temperature $Tf_{(2)}$ of intermediate layer 2 so as to bring about melting of intermediate layer 2 without however causing melting of epitaxial layer 3 or damage to epitaxial layer 3.

This thermal treatment advantageously further strengthens the bonding interface of the two surfaces placed in close contact during adhesion step S3 by molecular bonding (here epitaxial layer 3 and insulator layer 4). This strengthening step by application of thermal treatment is in fact generally necessary when adhesion by molecular bonding is performed and is compatible with the production method according to the invention. As an alternative embodiment, strengthening of the bonding interface can be implemented following step S3 and before step S4 in an annealing step performed at a lower temperature than the melting temperature of the intermediate layer.

Figure 1D:
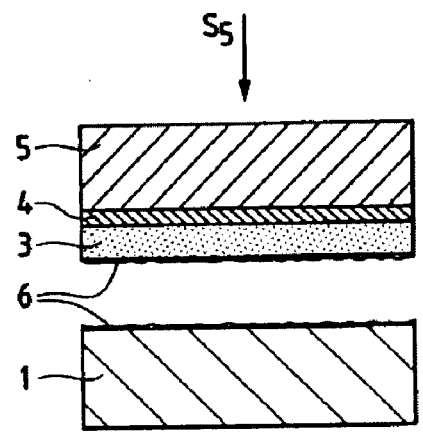

Melting of intermediate layer 2 caused by application of thermal treatment in step S4 enables epitaxial layer 3 to be detached from donor substrate 1 at the level of intermediate layer 2 in a step S5 (FIG. 1D).

In the example described here, detachment of epitaxial layer 3 is facilitated by application of mechanical separating forces at the same time as the thermal treatment is performed in step S4. Such mechanical separating forces are preferably shearing forces applied in the plane of intermediate layer 2.

Figure 6A:
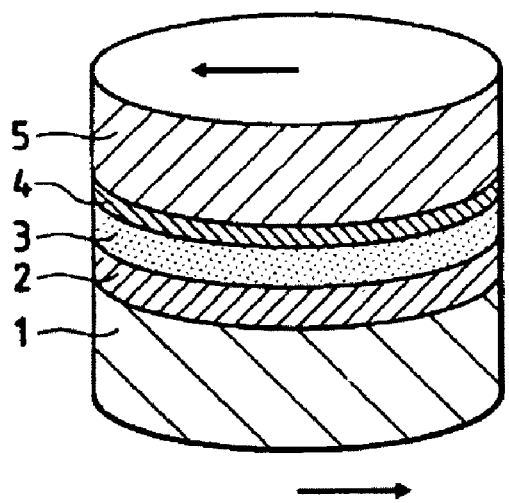
FIGS. 6A and 6B show application of shearing forces (translational movements) applied in the plane of the intermediate layer at the same time as thermal treatment during detachment of the epitaxial layer, in a particular embodiment of the invention.
Figure 6B:
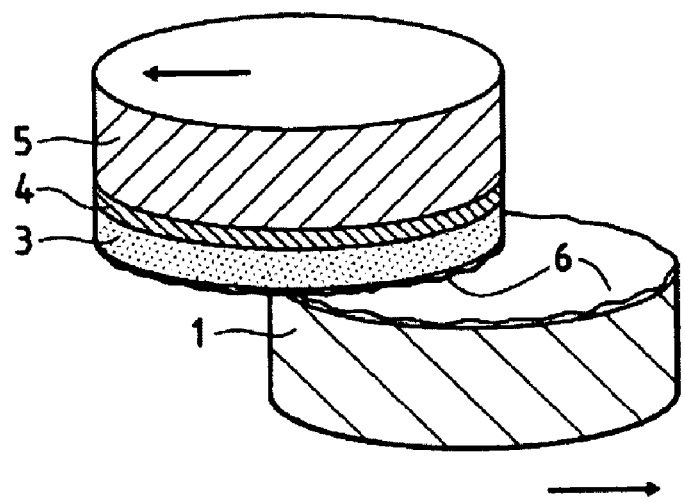

Application of shearing forces at the same time as the thermal treatment is performed can be implemented by means of gripping tools or means comprising electrostatic plates made from materials such as silicon carbide (SiC) or aluminium nitride (AlN) covered with suitable coatings enabling a good gripping force to be exerted on both sides of structure 11. The two electrostatic plates are then animated with movements that oppose one another, thereby creating a detachment stress at the level of melted intermediate layer 2 leading to detachment of epitaxial layer 3 from donor substrate 1. Such movements are for example rotational movements along an axis perpendicular to intermediate layer 2 or translational movements as represented in FIGS. 6A and 6B.

The electrostatic plates can further be provided with heating means to heat structure 11 to a higher temperature than the melting temperature of intermediate layer 2 to perform detachment of epitaxial layer 3. As an alternative, structure 11 on each side whereof the electrostatic plates are arranged can be placed in an enclosure heated to a higher temperature than the melting temperature of intermediate layer 2.

Other types of mechanical separating forces can be applied at the same time as the thermal treatment. Thus, document US 2004/0166653 presents gripping means whereby mechanical separating forces can be exerted in a plane perpendicular to intermediate layer 2.

In another embodiment of the invention, steps S4 and S5, can be performed under high pressure. The use of high pressure can enable phase change (i.e. melting) of the intermediate layer by applying thermal treatment at a lower temperature than the melting temperature of the intermediate layer. For example, these steps can be performed in an autoclave.

Figure 1E:
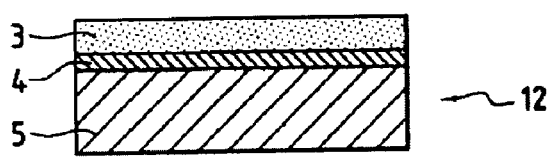

Step S5 of detachment of epitaxial layer 3 from donor substrate 1 is then followed by a cleaning step S6 of detached epitaxial layer 3 (FIG. 1E). This step consists in removing remainder 6 of intermediate layer remaining at the surface of detached epitaxial layer 3. In the example described here, a gallium nitride on insulator (GaNOI) structure 12 is thereby obtained.

Furthermore, during detachment step S5, in addition to structure 12 comprising detached epitaxial layer 3, donor substrate 1 is also obtained. After its surface has been cleaned, donor substrate 1 can be reused for example in a new implementation of the production method according to the invention.

Bonding step S3 of structure 10 onto a support substrate 5 is optional. In another embodiment of the invention, a support substrate 5 is in fact not bonded to epitaxial layer 3. The production method according to the invention then continues directly, after step S2 of formation of epitaxial layer 3, with detachment of epitaxial layer 3 only, implementing previously described steps S4, S5 and S6.

A structure 310 fabricated according to the previously described fabrication step of the production method according to the invention (step grouping previously described steps S1 and S2) is now described with reference to FIG. 3.

Figure 3:
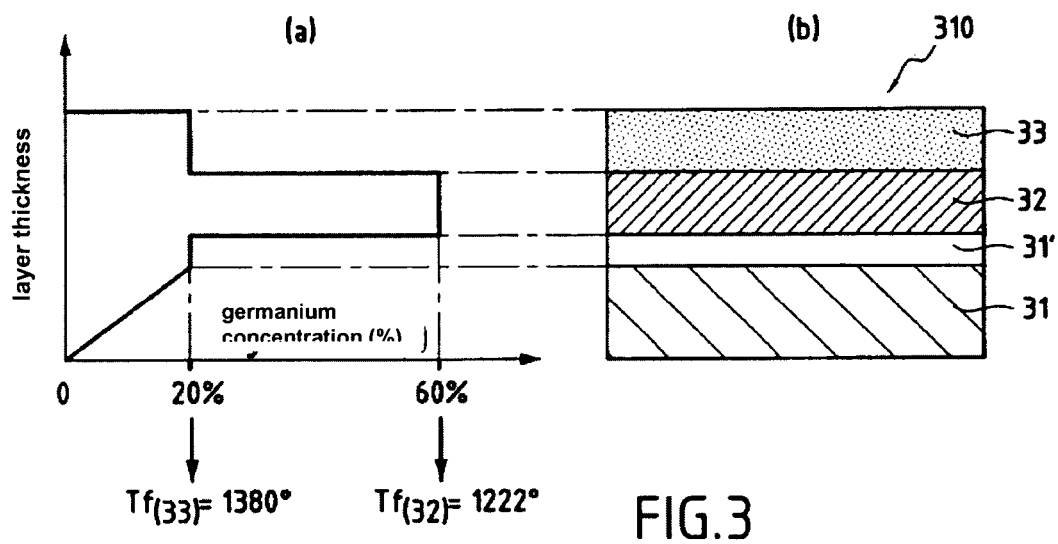
FIG. 3 represents facing one another:
a schematic cross-sectional view (b) of a structure obtained during the fabrication step of the production method according to the invention according to a particular embodiment in which the different layers are formed from silicon-germanium, and
a graph (a) representing the germanium concentration in each of the layers of the structure.

Structure 310 represented in FIG. 3 (b) comprises a substrate 31, an epitaxial layer 33 and an intermediate layer 32 between substrate 31 and epitaxial layer 33. It further comprises a spacer layer 31' between substrate 31 and intermediate layer 32.

In this embodiment, the different layers of structure 310 are formed from alloys of identical elements (i.e. silicon germanium alloys here) but in which the concentrations of the constitutive elements are different. These concentrations are chosen such that the melting temperature $Tf_{(32)}$ of intermediate layer 32 is lower than the melting temperature $Tf_{(33)}$ of epitaxial layer 33.

Thus, as represented in FIG. 3 (a):
substrate 31 is a SiGe layer having a germanium concentration increasing from 0 to 20%;

intermediate layer 32 is a SiGe layer having a germanium concentration equal to 60%;

epitaxial layer 32 is a SiGe layer having a germanium concentration equal to 20%.

The thickness of intermediate layer 32 is about 150 Å.

According to H. Stohr and W. Klemm's calculations (*Z. Anorg. Allgem. Chem.* 241, 1954, 305), the melting temperature of silicon germanium is given in degrees Celsius (° C.) by:

$$Tf(x)=1412-80x-395x^2 \quad (Eq.1)$$

where x designates the germanium concentration in the silicon germanium.

The melting temperature of silicon germanium is therefore a decreasing function of the germanium concentration: it can therefore be observed that by increasing the germanium concentration in silicon germanium layer, the melting temperature of the layer is reduced. Consequently, in structure 310 represented in FIG. 3, the melting temperature of intermediate layer 32 (Tf(32)=1222° C.) is lower than the melting temperature of epitaxial layer 33 (Tf(33)=1380° C.).

In this structure 310, to keep the lattice parameter, a silicon germanium spacer layer 31' with a germanium concentration equal to 20% is inserted between donor substrate 31 and intermediate layer 32. This spacer layer 31' moreover enables donor substrate 31 to be moved away from intermediate layer 32 and to be preserved during melting to be able to reuse it for example for a new implementation of the method according to the invention.

In this way, according to the equation (Eq.1), a structure 310 can be fabricated comprising an intermediate layer 32 and an epitaxial layer 33 having different germanium concentrations from those considered in FIG. 3 (*a*). The germanium concentration in intermediate layer 32 must be greater than the germanium concentration in epitaxial layer 33 to guarantee the constraint on the melting temperatures of these two layers according to the invention. However, in order not to damage epitaxial layer 33 when thermal treatment is applied at temperature T, it is preferable for melting temperatures $Tf_{(32)}$ and $Tf_{(33)}$ of the intermediate and epitaxial layers respectively not to be too similar. The germanium concentration of intermediate layer 32 is therefore preferably chosen such that the corresponding liquidus temperature is lower than the solidus temperature of the neighbouring layers, and in particular of epitaxial layer 33. This enables intermediate layer 32 to be completely melted without damaging the adjacent layers which will therefore not have started melting.

A difference of germanium concentration of about 40% enables this condition to be fulfilled. Thus for example in FIG. 3 (*a*), the germanium concentration in intermediate layer 32 is 60% whereas the germanium concentration in epitaxial layer 33 is 20% thereby guaranteeing a difference of 158° C. between the two melting temperatures for melting temperatures of more than 1000° C.

As an alternative, other alloys can be considered for fabrication of structure 310. The concentrations of elements in the alloys forming the different layers of structure 310 have to be chosen such that melting temperature $Tf_{(32)}$ of intermediate layer 32 is lower than melting temperature $Tf_{(33)}$ of epitaxial layer 33.

Figure 4:
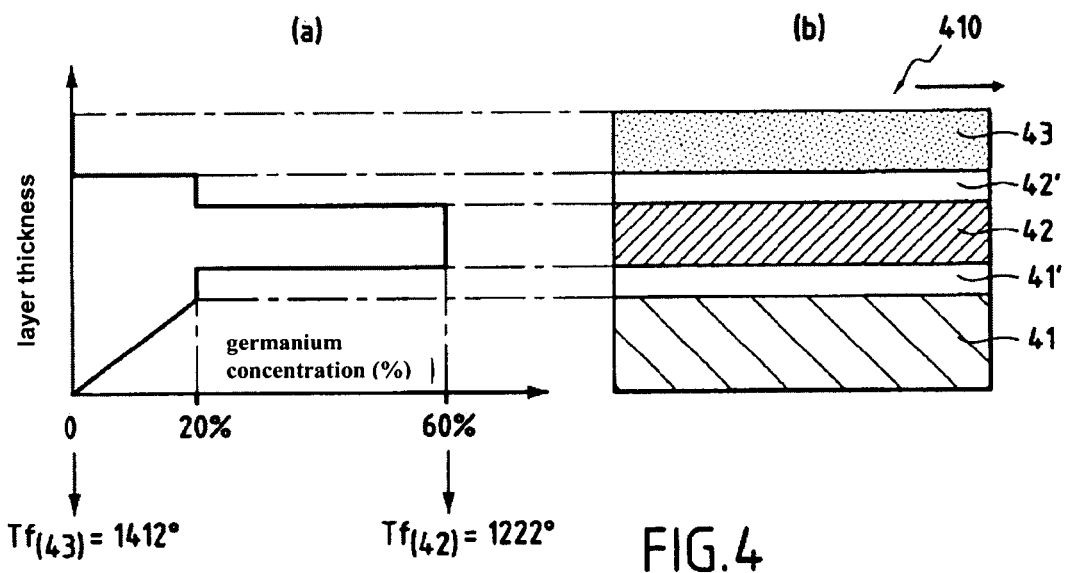
FIG. 4 represents facing one another:
a schematic cross-sectional view (b) of a structure obtained during the fabrication step of the production method according to the invention according to a particular embodiment in which the substrate and intermediate layer are formed from silicon-germanium, and the epitaxial layer is formed by growth of strained silicon on the intermediate layer; and
a graph (a) representing the germanium concentration in each of the layers of the structure.

FIG. 4(*b*) represents a schematic cross-sectional view of a structure 410 in another particular embodiment of the invention. In FIG. 4(*b*), structure 410 fabricated in the fabrication step of the production method according to the invention comprises a donor substrate 41, an intermediate layer 42, an epitaxial layer 43 and two spacer layers 41' and 42' respectively between donor substrate 41 and intermediate layer 42 and between intermediate layer 42 and epitaxial layer 43.

As represented in FIG. 4(*a*):

donor substrate 41 is formed by silicon germanium with a concentration increasing from 0 to 20%;

intermediate layer 42 is a silicon germanium layer with a germanium concentration equal to 60%;

spacer layers 41' and 42' are silicon germanium layers with a germanium concentration equal to 20%. These spacer layers have the role of stabilizing the lattice parameters of the different layers of structure 410.

The thickness of intermediate layer 42 is about 150 Å.

Epitaxial layer 43 is a strained silicon (sSI) layer formed by epitaxial growth on intermediate layer 42' of silicon germanium. Its melting temperature is equal to $Tf_{(43)}=1412°$ C. As seen before, the melting temperature of intermediate layer 42 is equal to $Tf_{(42)}=1222°$ C. and is therefore lower than the melting temperature $Tf_{(43)}$ of epitaxial layer 43.

By means of the production method according to the invention, this structure 410 for example enables a strained silicon on insulator (sSOI) structure to be obtained.

Figure 5:
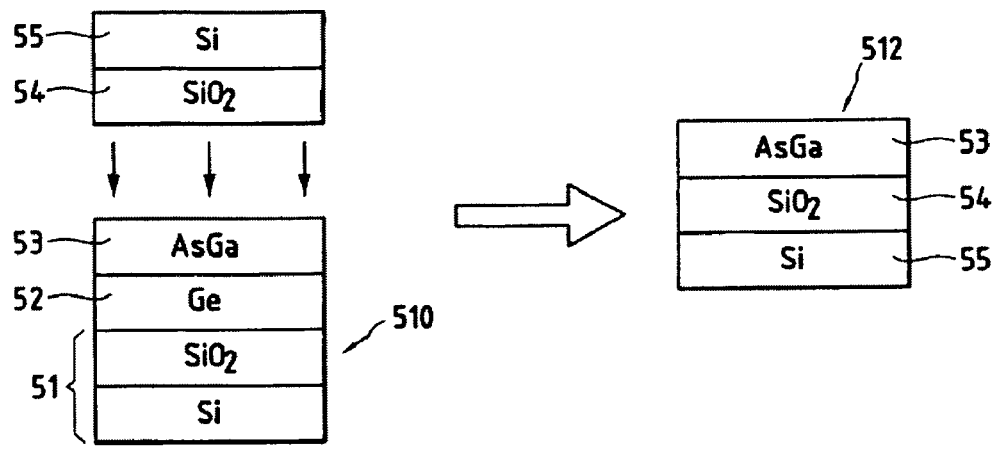
FIG. 5 represents a schematic cross-sectional view of a structure fabricated during the fabrication step of the production method according to the invention leading after the detachment step to a gallium arsenide on insulator (AsGaOI) structure, in a particular embodiment of the invention.
Figure 2:
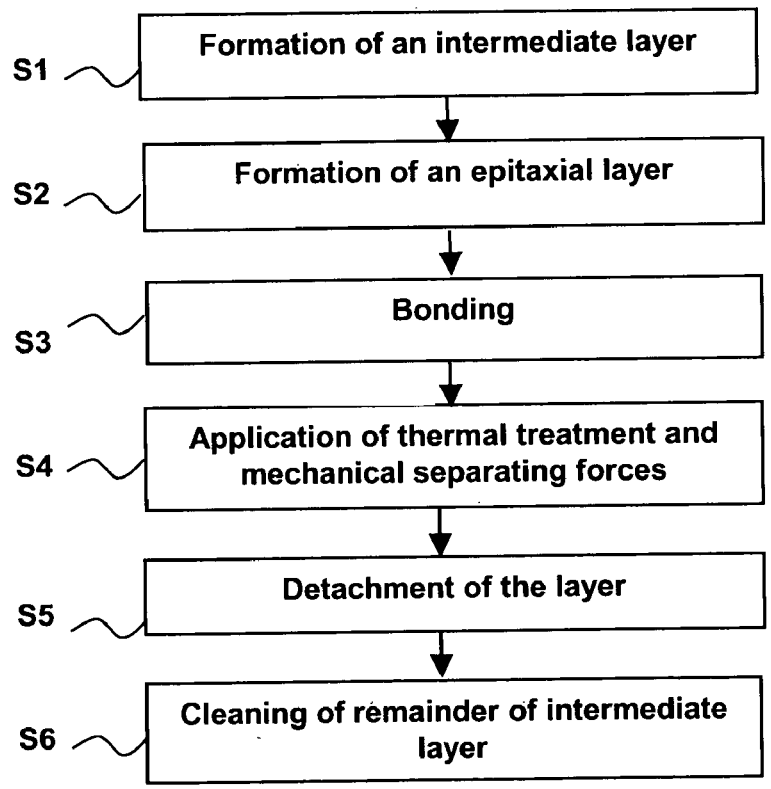
FIG. 2 is a flowchart of the steps implemented in FIGS. 1A to 1E according to an embodiment of the invention.

In the example described with reference to FIG. 5, structure 510 comprises:

a silicon donor substrate 51 covered by a silicon dioxide layer;

a germanium intermediate layer 52 whose melting temperature $Tf_{(52)}=937°$ C. Germanium intermediate layer 52 is the top layer of a GeOI structure;

a gallium arsenide epitaxial layer 53 formed by pseudomorphic epitaxy on intermediate layer 52 and having a melting temperature $Tf_{(53)}=1240°$ C. Structure 510 fabricated in this way is then bonded onto a silicon support substrate 55 covered with a layer 54 of silicon dioxide $SiO_2$. After detachment, a gallium arsenide on insulator (AsGaOI) structure is obtained.

As an alternative, it is now assumed that, in the above-mentioned structure 510, gallium arsenide epitaxial layer 53 is a layer with a thickness of a few hundred microns (e.g. 400 microns) formed by epitaxy on intermediate layer 52. This layer is sufficiently thick for a self-supported substrate to be produced. For this, detachment of epitaxial layer 53 is performed directly (without a preliminary step of bonding on a support substrate) by melting of intermediate layer 52. The method according to the invention thus advantageously enables a self-supported AsGa substrate to be produced. As described above, the production method according to the invention enables a self-supported epitaxial layer to be produced on a support substrate. In the latter embodiment, the production method according to the invention constitutes a method for transferring an epitaxial layer onto a support substrate. Thus, the production method according to the invention can be associated with other complementary treatments, not described here but known to persons skilled in the art, usually associated with a method for transferring an epitaxial layer onto a support substrate (for example with the SmartCut™ method). It can therefore, in this respect, enable transfer of certain pattern layers, transfer of quantum well layers or of quantum wires, or transfer of printed circuits.

The invention claimed is:

1. A method for producing an epitaxial layer which comprises:

fabricating a structure by forming an intermediate layer on a donor substrate and forming the epitaxial layer on the intermediate layer by epitaxy to form the structure, wherein the melting temperature of the intermediate layer is lower than the melting temperature of the epitaxial layer; and detaching the epitaxial layer from the donor substrate by applying at least one thermal treatment to the entire structure, with the thermal treatment conducted at a temperature that is between the melting temperature of the intermediate layer and the melting temperature of the epitaxial layer, wherein the detaching includes applying mechanical separating forces while the thermal treatment is conducted.

2. The method of claim 1, which further comprises bonding the epitaxial layer to a support substrate after fabricating the structure but before detaching the epitaxial layer.

3. The method of claim 2, wherein the epitaxial layer is bonded to an oxide layer on the surface of the support substrate.

4. The method of claim 2, wherein the bonding is molecular bonding.

5. The method of claim 2, which further comprises conducting a thermal treatment to strengthen the bond between the epitaxial layer and support substrate prior to detaching.

6. The method of claim 1, which further comprises removing any intermediate layer remaining on the detached epitaxial layer.

7. The method of claim 1, wherein the intermediate layer is formed by epitaxy on the donor substrate.

8. The method of claim 1, wherein the intermediate layer and donor substrate are formed from a SeOI structure.

9. The method of claim 1, wherein the intermediate layer and epitaxial layer each comprises silicon-germanium, with the intermediate layer formed with a higher germanium concentration than that of the epitaxial layer so that the melting temperature of the intermediate layer is lower than the melting temperature of the epitaxial layer.

10. The method of claim 1, wherein the donor substrate and intermediate layer each comprises silicon-germanium, with the germanium concentration in the intermediate layer being greater than the germanium concentration in the donor substrate; and the epitaxial layer is a strained silicon layer.

11. The method of claim 10, which further comprises providing at least one spacer layer between the donor substrate and the intermediate layer or between the intermediate layer and the epitaxial layer.

12. The method of claim 1, wherein the donor substrate is silicon covered with a silicon dioxide layer; the intermediate layer is germanium; and the epitaxial layer is gallium arsenide.

13. The method of claim 1, wherein the donor substrate comprises sapphire; the intermediate layer comprises nitride; and the epitaxial layer comprises gallium nitride.

14. The method of claim 1, wherein the at least one thermal treatment is applied to melt the intermediate layer and detach the epitaxial layer from the substrate at the level of the melted intermediate layer.

* * * * *